United States Patent
Ferraiolo et al.

(10) Patent No.: US 7,116,142 B2
(45) Date of Patent: Oct. 3, 2006

(54) APPARATUS AND METHOD FOR ACCURATELY TUNING THE SPEED OF AN INTEGRATED CIRCUIT

(75) Inventors: Frank David Ferraiolo, New Windsor, NY (US); James Stephen Fields, Jr., Austin, TX (US); Norman Karl James, Liberty Hill, TX (US); Bradley David McCredie, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 11/002,548

(22) Filed: Dec. 2, 2004

(65) Prior Publication Data

US 2006/0119397 A1   Jun. 8, 2006

(51) Int. Cl.
   *H03L 7/06* (2006.01)
(52) U.S. Cl. ...................... 327/149; 327/158
(58) Field of Classification Search ........ 327/149–155, 327/158–163; 331/17, 25, DIG. 2; 375/373, 375/375, 376
   See application file for complete search history.

(56) References Cited

U.S. PATENT DOCUMENTS

| | | | | |
|---|---|---|---|---|
| 6,043,694 A | * | 3/2000 | Dortu | 327/156 |
| 6,295,328 B1 | * | 9/2001 | Kim et al. | 375/376 |
| 6,392,456 B1 | * | 5/2002 | Pyeon et al. | 327/156 |
| 6,437,619 B1 | * | 8/2002 | Okuda et al. | 327/158 |
| 6,693,473 B1 | * | 2/2004 | Alexander et al. | 327/158 |

* cited by examiner

*Primary Examiner*—Linh My Nguyen
(74) *Attorney, Agent, or Firm*—Duke W. Yee; Thomas E. Tyson; Brian D. Owens

(57) ABSTRACT

An apparatus and method for accurately tuning the speed of an integrated circuit, i.e. a computer chip, using a built-in sense circuit and controller are provided. The sense circuit is provided in association with a monitored path. The sense circuit includes a variable delay element coupled to a controller. A data signal from the monitored path is provided to the sense circuit which adds an amount of delay as determined by the controller to the data signal. The delayed data signal and the original data signal are compared to determine if their values match. If they match, then the amount of delay added by the variable delay element is increased. If they do not match, then a previous amount of delay, prior to the mismatch, is output as the slack of the monitored path. The slack may then be used to tune the speed of the integrated circuit.

20 Claims, 3 Drawing Sheets

APPARATUS AND METHOD FOR ACCURATELY TUNING THE SPEED OF AN INTEGRATED CIRCUIT

BACKGROUND OF THE INVENTION

1. Technical Field

The present invention is generally directed to an improved mechanism for sensing a maximum speed of a path in an integrated circuit and controlling operation of the integrated circuit timing based on the sensed maximum speed. More specifically, the present invention is directed to an apparatus and method for accurately tuning the speed of a computer chip using a built-in sense circuit and controller.

2. Description of Related Art

When integrated circuits, or chips, are manufactured, due to inaccuracies in the manufacturing methodology the integrated circuits need to be tested to determine their actual operational characteristics. Typically, these chips are sorted at the device level to segregate them into performance ranges, e.g., slow, medium and fast with respect to their expected operational speed.

The testing of these chips is typically performed with regard to the critical path or paths of the chip. That is, the critical path timing limits the speed of the chip. The testing may be performed, for example, using an AC Built-In Self Test (BIST). During AC BIST, the critical paths on the chip are exercised and the chips are sorted based on the maximum speed obtained during the test. Faster chips are sold at a premium relative to slower chips.

While such AC BIST based testing of integrated circuits provides a mechanism for sorting integrated circuits at manufacture time, the results of such testing may not be completely accurate when the integrated circuit is placed in a functional system. That is, because the functional system may have different characteristics from the test, different results may be obtained from the chip when it is placed in a functional system.

A consumer of chips that purchases chips of a particular performance range may desire to obtain additional performance out of the chips. In order to gain the additional performance, the power supply voltage is increased at the system level. However, simply increasing the supply voltage to obtain a higher level of performance is often prohibited for cooling reasons.

Thus, it would be beneficial to have an apparatus and method for sensing the maximum achievable speed of an integrated circuit in a functional system. Moreover, it would be beneficial to have an apparatus and method for sensing the achievable speed of an integrated circuit dynamically such that the speed of the integrated circuit may be dynamically controlled in a functional system.

SUMMARY OF THE INVENTION

The present invention provides a mechanism for accurately tuning the speed of an integrated circuit, i.e. a computer chip, using a built-in sense circuit and controller. With the present invention, a sense circuit is added to a path, e.g., a critical path or clone path, in the integrated circuit before a first capture latch. In one exemplary embodiment of the present invention, the sense circuit includes a variable delay element coupled to a controller. The variable delay element receives as input the data signal from the monitored path and a control voltage from the controller. An output of the variable delay element is provided to a second capture latch, similar to the first capture latch used in the monitored path.

An output from the first capture latch and the output from the second capture latch are provided to an exclusive OR gate. The exclusive OR gate compares the output of the two latches so that if the outputs are the same, a first output is generated and if the outputs are different, i.e. there is a miscompare, then a second output is generated. The output from the exclusive OR gate is provided to the controller so as to inform the controller of the results of the comparison.

In operation, a clock input to the monitored path is started and operation of the integrated circuit begins at a clock speed capable of handling a worse case functional path. The resulting data signal output to the first capture latch is also provided to the variable delay element. The variable delay element adds a delay to the data signal and provides the delayed data signal to the second capture latch. The data signal from the first capture latch and the delayed data signal from the second capture latch are provided to the exclusive OR gate. If the amount of the delay is such that the delayed data signal and the data signal from the first capture latch do not have the same value, then a miscompare is registered by the exclusive OR gate and an output from the exclusive OR gate to the controller indicating this miscompare is generated. If the delayed data signal and data signal from the first capture latch still have the same value, then the exclusive OR gate outputs a signal to the controller indicating that the data signals have the same value.

The sense circuit of the present invention may be used to determine the amount of slack in the monitored path, i.e. the amount of delay possible before the path becomes non-functional, e.g., data is not correctly captured in a destination latch. In order to measure the slack, additional delay is added by the variable delay element based on a control input from the controller until the data signal output of the monitored path and the delayed data signal output of the sense circuit path miscompare. The delay setting just prior to this miscompare represents the slack in the monitored path.

Thus, if the exclusive OR gate outputs a signal indicating that the data signal from the monitored path and the delayed data signal from the sense circuit have the same value, the controller increases the delay of the variable delay element by outputting an appropriate control voltage signal to the variable delay element. The controller maintains a value indicative of the control signal generating the previous delay setting of the variable delay element in a storage element associated with the controller. If the exclusive OR gate outputs a signal indicating a miscompare of the data signal and the delayed data signal, the controller does not increase the delay of the delay element but outputs a signal indicative of the slack based on the value stored by the controller representing the control signal for the previous delay setting.

The slack output from the controller may be provided to a monitoring element for various uses. For example, the slack output may be used to validate true performance of the integrated circuit, determine model to hardware correlation, to dynamically control the operation of the integrated circuit, for identifying a true speed of the integrated circuit for "binning" or classifying of the integrated circuit into a speed classification, or other pre- or post-assembly uses.

The present invention may be used in combination with other sensing elements, such as a temperature sensing element, in order to ensure that there is no damage/reliability concerns with regard to the integrated circuit when increasing the speed of the integrated circuit based on the identified slack. In other words, in order to address the possibility that there is slack in the monitored path but a reliability or safety concern develops because of out-of-specification conditions, additional sensing elements may be used in combination with the present invention in order to avoid such reliability or safety concerns.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
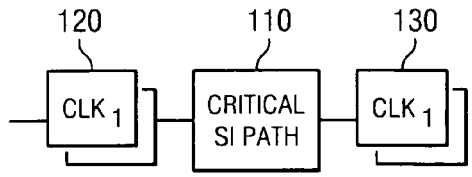
FIG. 1 is an exemplary diagram illustrating a timing flow of critical path of an integrated circuit.

FIG. 1 is an exemplary diagram illustrating a timing flow of critical path of an integrated circuit or computer chip. For purposes of this description, the terms "integrated circuit" and "chip" are used interchangeably. Under worse case conditions (e.g., slow process, high temperature, low power supply), the critical path limits the speed of the integrated circuit or computer chip. In a conventional design the integrated circuit would be sorted into "speed buckets" based on a manufacturing test, such as an AC BIST. Faster chips are sold at a premium relative to slower chips. Typically, the upper speed is fixed and guaranteed over a specified temperature and supply voltage range.

If a customer operates the chip, or the system in which the chip is implemented, at below the maximum allowed temperature and/or above the minimum allowed power supply, there would be a significant amount of timing margin, i.e. the difference between the identified speed of the chip and the maximum speed of the chip. The maximum speed of the system/chip may be determined as the speed at which the critical path is operating that is just below the speed the specific process, temperature and power supply will allow. FIG. 1 illustrates one mechanism for determining this maximum speed.

As shown in FIG. 1, a clock signal clk1 is sent to the functional latch 120 which provides the clock signal to critical Si path 110. The output of the critical Si path is captured by slack latch 130. Typically for known AC Built-In-Self-Test (BIST) systems, the clock period of the clock signal being input to the functional latch 120 is reduced until the Si path becomes non-functional, i.e. the data is not correctly captured in the slack latch 130. The clock period existing just prior to the Si path becoming non-functional indicates the shortest clock period that is achievable by the integrated circuit. Thus, this indicates the maximum speed of the integrated circuit.

Obviously, such testing of the critical path of an integrated circuit cannot be performed dynamically which the integrated circuit is operating in a system. To the contrary, such testing is typically performed prior to assembly of the system, such as during a "binning" or "speed grade" classification process for placing the integrated circuit into a "speed bucket." Because such testing is performed prior to assembly of the system, environmental affects cannot be included in the testing. That is, affects from cross-talk, temperature, and other environmental affects of a system in which the chip is utilized cannot be represented in the pre-assembly testing of the chip.

The present invention provides a mechanism for testing one or more paths (critical or otherwise) in an integrated circuit or computer chip in either or both of a pre-assembly or post-assembly stage. The present invention provides a sensing circuit that is built-into the integrated circuit or computer chip and tests an associated path to determine a slack of the path. The path that is tested may be the actual path in the integrated circuit or a clone of the path that is used for testing purposes.

The optimum metric for determining this maximum speed is to measure the slack in the critical path(s) directly. The slack in a critical path is how much additional delay can be tolerated in the path and still meet the current operating frequency, i.e. the amount of delay that can be tolerated before the path becomes non-functional. A path becomes non-functional when the data output of the path is not correctly captured in a destination latch. If a critical path can be demonstrated to have slack, then the frequency of the chip can be increased. Hence, if a purchaser of a chip is operating the chip/system at below maximum temperature or above minimum voltage, the critical path will have slack and the clock period could be reduced (i.e. increase the clock frequency).

The sensing circuit of the present invention provides a mechanism for measuring this slack and providing an output indicating the amount of slack in a monitored path. In this way, a maximum speed of the chip can be determined while the chip is operating in an assembled system such that environmental affects are taken into account in the measuring of the slack. Alternatively, this same testing may also be performed prior to assembly when environmental affects are not of a concern during testing.

Figure 2:
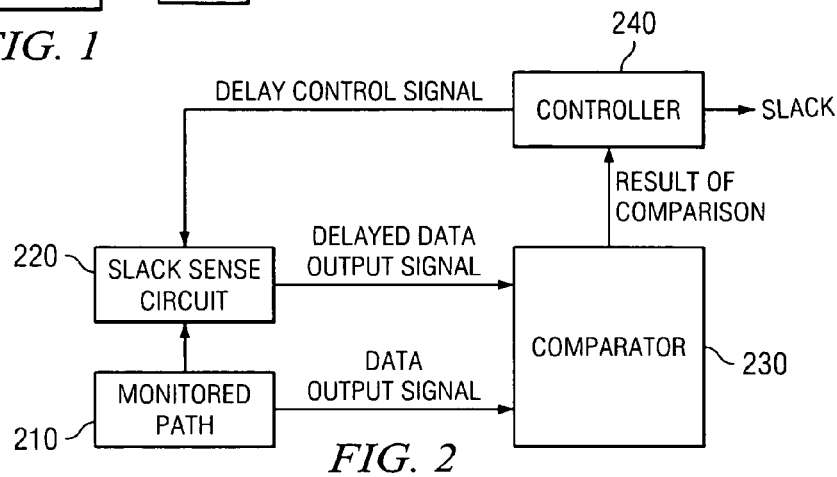
FIG. 2 is an exemplary block diagram of an integrated circuit slack sensing and control mechanism in accordance with one exemplary embodiment of the present invention.

FIG. 2 is an exemplary block diagram of an integrated circuit slack sensing and control mechanism in accordance with one exemplary embodiment of the present invention. As shown in FIG. 2, a slack sense circuit 220 is provided in association with a monitored path 210. The monitored path 210 may be a critical path in an integrated circuit, a clone path of a path of interest, or the like. The monitored path 210 provides a data output signal to the slack sense circuit 220 which then adds a delay component to the data output signal to generate a delayed data output signal.

The delayed data output signal is provided by the slack sense circuit 220 to the comparator 230. The comparator 240 also receives the data output signal from the monitored path 210. The delayed data output signal from the slack sense circuit 220 is compared to the data output signal from the monitored path 210 to determine if the values of the signals match. If the values of the signals do not match, a "miscompare" is detected. The comparator 230 outputs a signal to the controller 240 indicating the results of the comparison, i.e. either a match or a miscompare.

The amount of the delay added to the data output signal is controlled by the controller 240. The controller 240 increases the delay until the comparator 230 detects a miscompare between the delayed data output signal from the slack sense circuit 220 and the data output signal from the monitored path 210. When the comparator 230 indicates a miscompare, the controller 240 outputs a signal having a value of the delay for the previous iteration, i.e. the amount of the delay added to the data output signal in an iteration just prior to the iteration where a miscompare is detected. This value is indicative of the slack of the monitored path.

As mentioned above, the mechanism of the present invention may be used in conjunction with environmental sensor circuitry (not shown) to provide added protection against damage to the integrated circuit/chip. For example, in an embodiment of the present invention where the present invention is utilized to dynamically determine the slack of monitored path, e.g., to determine the maximum speed of the integrated circuit/chip, a temperature sensing circuit may be utilized to limit the speed of the integrated circuit/chip so as to avoid dangerous operational temperatures.

While FIG. 2 illustrates the mechanisms of one exemplary embodiment of the present invention with regard to a single monitored path 210, the present invention is not limited to such. Rather, the mechanisms illustrated in FIG. 2 may be replicated for a plurality of paths of interest in an integrated circuit or computer chip. These paths may be critical paths, cloned paths, or simply representative paths within the integrated circuit/chip.

The mechanism of FIG. 2 may be implemented and utilized in a pre-assembly environment, i.e. prior to the integrated circuit/chip being assembled into a computing system. Using the present invention, the maximum speed of the integrated circuit/chip may be detected and output for use in "binning" or categorizing the integrated circuit/chip into a speed category. In this way, the integrated circuits/chips may be placed in different speed categories for sale at differing prices based on their maximum achievable speed.

Further the determination of maximum speed of the integrated circuit/chip may be done dynamically in a post-assembled environment, i.e. after the integrated circuit/chip is assembled into a computing system and is in an operational state. There are many uses for determining the speed of an integrated circuit/chip dynamically. For example, the mechanisms of the present invention may be used to dynamically modify the operation of the integrated circuit/chip in the assembled system. For example, as the voltage and temperature of the integrated circuit/chip increase or decrease, the clock frequency may be manipulated to ensure the maximum possible operating frequency is delivered under all conditions. Moreover, the chip may be controlled so as to purposely cycle the clock frequency, if the temperature is low, the system may obtain a boost in performance, creating a higher temperature, then the speed could be decreased to allow the system to cool back down. Other uses of the mechanisms of the present invention, as will become apparent to those of ordinary skill in the art in view of this description, are intended to be within the spirit and scope of the present invention.

Figure 3:
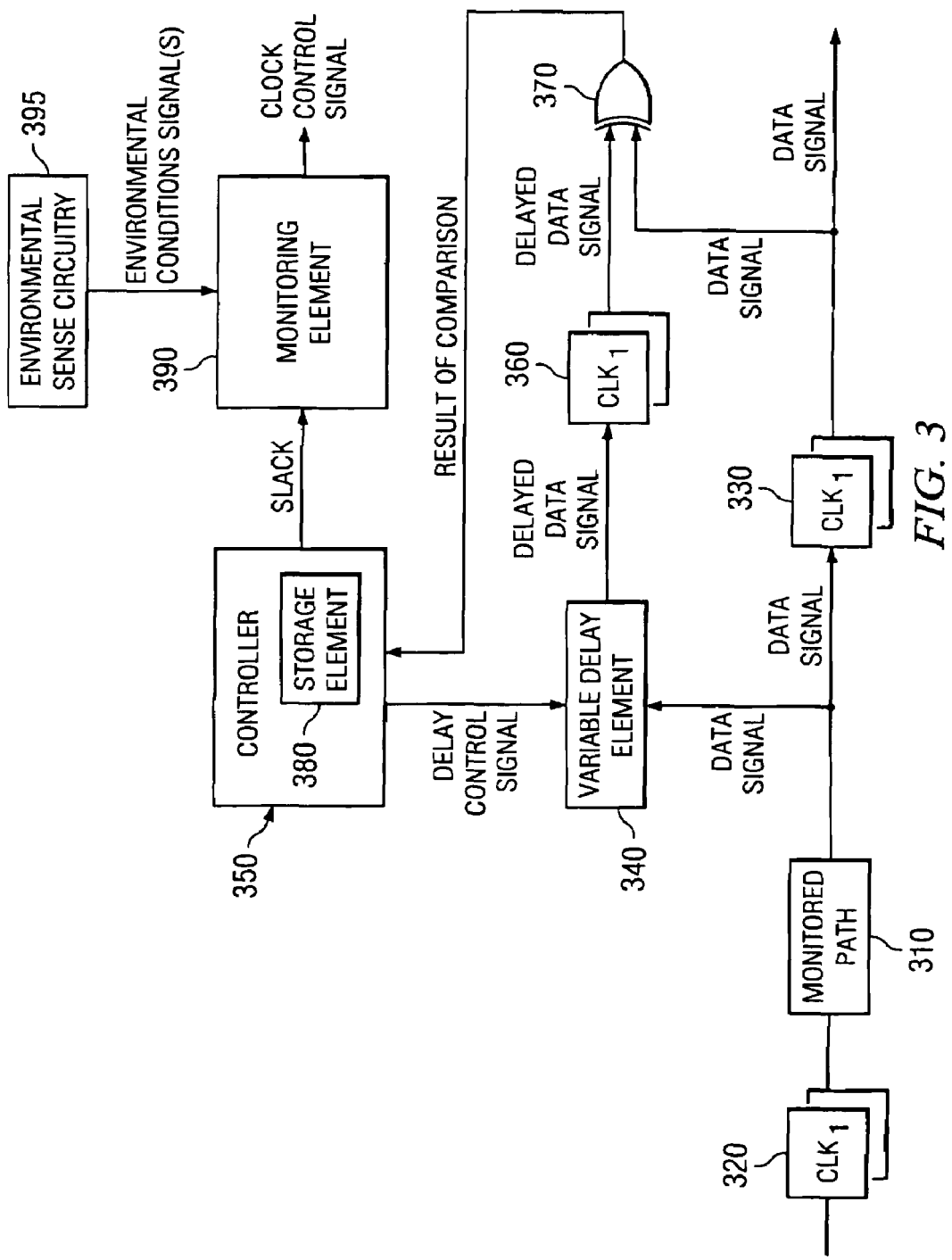
FIG. 3 is an exemplary circuit diagram illustrating the sensing element of one exemplary embodiment for sensing the available slack of a critical path.

FIG. 3 is an exemplary circuit diagram illustrating the sensing element of one exemplary embodiment for sensing the available slack of a critical path. As described above, the present invention provides a mechanism for accurately tuning the speed of an integrated circuit, i.e. a computer chip, using a built-in sense circuit and controller. With the present invention, a sense circuit is added in association with a path, e.g., a critical path or clone path, in the integrated circuit before a first capture latch 330. In one exemplary embodiment of the present invention, the sense circuit includes a variable delay element 340 coupled to a controller 350. The variable delay element 330 receives as input the data signal from the monitored path 310 and a control voltage from the controller 350. An output of the variable delay element 340 is provided to a second capture latch 360, similar to the first capture latch 330 used by the monitored path 310.

An output from the first capture latch 330 and the output from the second capture latch 360 are provided to an exclusive OR gate 370. The exclusive OR gate 370 compares the output of the two latches 330 and 360 so that if the outputs are the same, a first result output is generated by the exclusive OR gate 370 and if the outputs are different, i.e. there is a miscompare, then a second output is generated by the exclusive OR gate 370. The output from the exclusive OR gate 370 is provided to the controller 350 so as to inform the controller 350 of the results of the comparison.

In operation, a clock input $clk_1$ to the monitored path 310 is started and operation of the integrated circuit begins at a clock speed capable of handling a worse case functional path. The resulting data signal output to the first capture latch 330 is also provided to the variable delay element 340. The variable delay element 340 adds a delay to the data signal and provides the delayed data signal to the second capture latch 360. The data signal from the first capture latch 330 and the delayed data signal from the second capture latch 360 are provided to the exclusive OR gate 370. If the amount of the delay is such that the delayed data signal and the data signal from the first capture latch 330 do not have the same value, a miscompare is registered by the exclusive OR gate 370 and an output from the exclusive OR gate 370 to the controller 350 indicating this miscompare is generated. If the delayed data signal and data signal from the first capture latch 330 still have the same value, then the exclusive OR gate 370 outputs a signal to the controller 350 indicating that the data signals have the same value.

The sense circuit of the present invention may be used to determine the amount of slack in the monitored path 310, i.e. the amount of delay possible before the path becomes non-functional, e.g., data is not correctly captured in a destination latch. In order to measure the slack, additional delay is added by the variable delay element 340 based on a control input from the controller 350 until the data signal output of the monitored path 310 and the delayed data signal output of the sense circuit path miscompare. The delay setting just prior to this miscompre represents the slack in the monitored path.

Thus, if the exclusive OR gate 370 outputs a signal indicating that the data signal from the monitored path 310 and the delayed data signal from the sense circuit have the same value, the controller 350 increases the delay of the variable delay element 340 by outputting an appropriate control voltage signal to the variable delay element 340. The controller 350 maintains a value indicative of the control signal generating the previous delay setting of the variable delay element 340 in a storage element 380 associated with the controller 350. If the exclusive OR gate 370 outputs a signal indicating a miscompare of the data signal and the delayed data signal, the controller 350 does not increase the delay of the variable delay element 340 but outputs a signal indicative of the slack based on the value stored by the controller 350 in the storage element 380 representing the control signal for the previous delay setting.

The slack output from the controller 340 may be provided to a monitoring element 390 for various uses. For example, the slack output may be used to validate true performance of the integrated circuit, determine model to hardware correlation, to dynamically control the operation of the integrated circuit, for identifying a true speed of the integrated circuit for "binning" or classifying of the integrated circuit into a speed classification, or other pre- or post-assembly uses.

The present invention may be used in combination with other environmental sensing elements 395, such as a temperature sensing element, in order to ensure that there are no damage/reliability concerns with regard to the integrated circuit when increasing the speed of the integrated circuit based on the identified slack. In other words, in order to address the possibility that there is slack in the monitored path 310 but a reliability or safety concern develops because of out-of-specification conditions, additional sensing elements 395 may be used in combination with the present invention in order to avoid such reliability or safety concerns. Output from such additional sensing elements 395 may also be provided to the monitoring element 390 for use, along with the identified slack, in determining a clock control signal for increasing or decreasing the frequency of the clock.

The controller 350 may be reinitialized periodically in order to repeatedly monitor the monitored path 310 and determine if the slack of the monitored path 310 has changed, such as due to environmental affects. In this way, the slack measurement made by the present invention may be dynamically updated so that dynamic control of the clock frequency is achieved.

Figure 5:
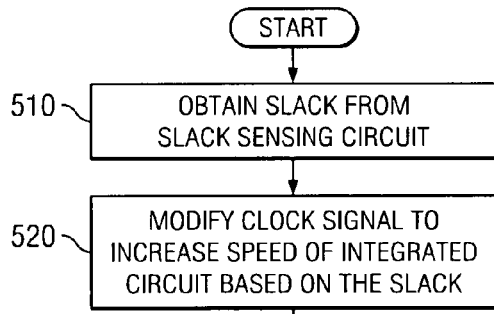
FIG. 5 is flowchart outlining an exemplary operation of the present invention when dynamically controlling the operation of an integrated circuit based on a dynamically sensed slack of a critical path of the integrated circuit.
Figure 5:
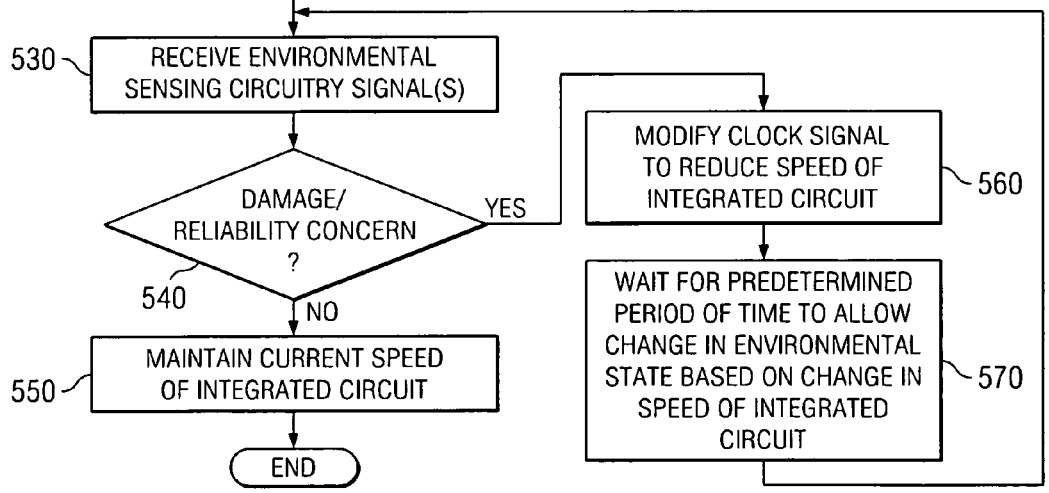
Figure 4:
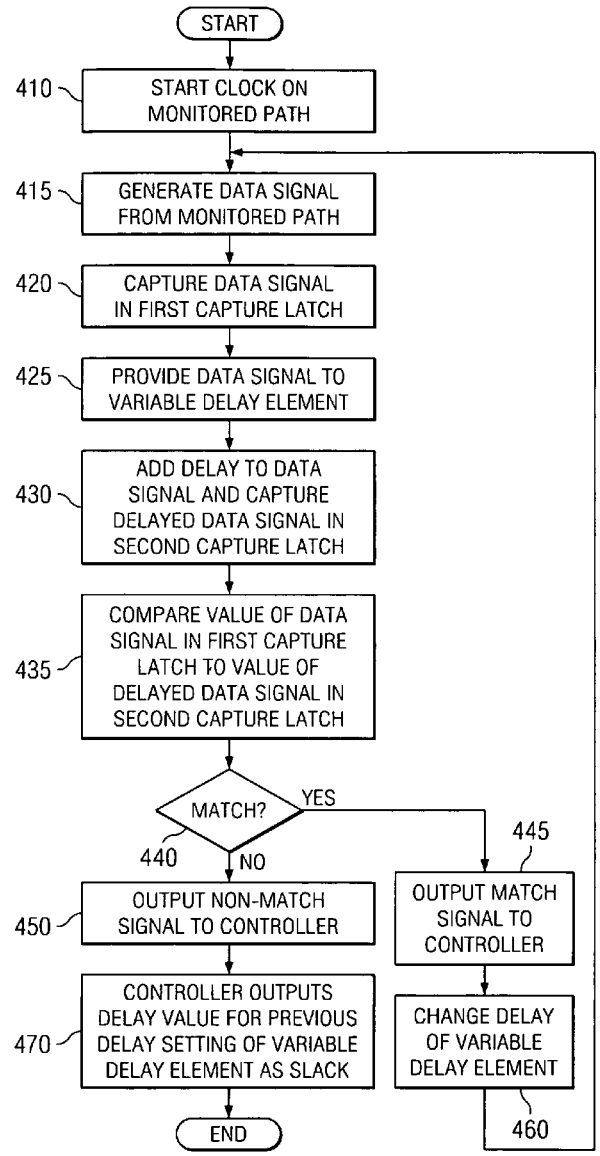
FIG. 4 is a flowchart outlining an exemplary operation of the present invention for testing the speed of an integrated circuit.

FIGS. 4 and 5 illustrate exemplary operations of exemplary embodiments of the present invention. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

FIG. 4 is a flowchart outlining an exemplary operation of the present invention for testing the speed of an integrated circuit. As shown in FIG. 4, the operation starts with a starting of the clock on the monitored path (step 410). A data signal is generated from the monitored path (step 415) and is captured by a first capture latch (step 420). The data signal is also provided to a variable delay element (step 425) which adds a delay to the data signal and the delayed data signal is captured in a second capture latch (step 430).

The values of the data signal and the delayed data signal are then compared (step 435) and a determination is made as to whether they match or not (step 440). If the data signal and delayed data signal have values that match, then a match signal is output to the controller (step 445). The controller changes the delay of the variable delay element (step 460) and the operation returns to step 415.

If the data signal and delayed data signal have values that do not match, a non-match output signal is sent to the controller 450 and the controller outputs the delay value for the previous delay setting of the variable delay element (step 470). This delay value represents the slack in the monitored path. The operation then ends.

FIG. 5 is flowchart outlining an exemplary operation of the present invention when dynamically controlling the operation of an integrated circuit based on a dynamically sensed slack of a critical path of the integrated circuit. As shown in FIG. 5, the operation starts by obtaining the slack from the slack sensing circuit of the present invention (step 510). The clock signal is modified to increase the speed of the integrated circuit based on the slack (step 520). Environmental sensing circuitry signals are then received (step 530).

A determination is made as to whether there is a damage/reliability concern based on the environmental sensing circuitry signals (step 540). If there is a concern, the clock signal is modified to reduce the speed of the integrated circuit (step 560). The operation then waits for a predetermined period of time to allow the change in the speed of the integrated circuit to affect the environmental state of the integrated circuit (step 570) and the operation returns to step 530. If there is no damage/reliability concern based on the environmental sensing circuitry signals (step 530), then the current speed of the integrated circuit is maintained (step 550) and the operation ends.

Thus, the present invention provides a mechanism for measuring the slack in a monitored path of an integrated circuit/chip. The present invention may be used in either a pre-assembly or post-assembly environment and may be used to dynamically modify the operation of the integrated circuit/chip so as to achieve optimum speed of the integrated circuit/chip under various environmental conditions. In addition, the present invention may be used to classify integrated circuits/chips into various speed categories or "buckets" for purposes of sale.

It should be noted that while the above preferred embodiments of the present invention have been described in terms of the testing the slack of a path in an integrated circuit using a functional clock signal, the present invention is not limited to such. To the contrary, rather than using the functional clock signal, the path being tested may be stressed with an early clock, i.e. a clock signal that arrives earlier in time or phase than the functional clock. The mechanisms of the present invention may operate in a similar manner as described above just with an early clock signal that is used solely for testing the slack of the path and is not used for functional purposes.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for determining the slack in a monitored path on an integrated circuit, comprising:
   capturing a data signal from the monitored path;
   adding a first delay to the data signal from the monitored path to generate a delayed data signal;
   comparing a first value of the data signal to a second value of the delayed data signal;
   determining if the first value and the second value match; and
   outputting a third value corresponding to a second delay of the delayed data signal, the third value being indicative of the slack in the monitored path for evaluating speed performance of the integrated circuit, if the first value and the second value do not match, wherein the third value is used to tune a speed of the integrated circuit.

2. The method of claim 1, wherein the third value corresponds to an amount of delay added to the data signal in a previous comparison of the first value to the second value just prior to the comparison resulting in the first value and second value not matching.

3. The method of claim 1, further comprising:
   increasing an amount of the delay added to the data signal if the first value and the second value match; and
   repeating the adding, comparing and determining steps using the increased amount of the delay.

4. The method of claim 1, wherein comparing a first value of the data signal to a second value of the delayed data signal includes providing the delayed data signal and the data signal to a comparator circuit element.

5. The method of claim 4, wherein the comparator circuit element is an exclusive OR gate.

6. The method of claim 3, wherein adding a first delay to the data signal from the monitored path to generate a delayed data signal includes inputting the data signal to a variable delay circuit element which outputs the delayed data signal to a capture latch, and wherein increasing an amount of the delay added to the data signal if the first value and the second value match includes sending a control signal to the variable delay circuit element to increase the amount of the delay added by the variable delay circuit element to the data signal.

7. The method of claim 1, wherein the method is performed in response to a functional clocking of the monitored path.

8. The method of claim 1, wherein the method is performed in response to an early clocking of the monitored path in which an early clock signal is earlier in time or phase than a functional clock signal.

9. The method of claim 1, wherein the method is performed on chip in the integrated circuit after assembly of the integrated circuit in a functioning system.

10. The method of claim 1, wherein the method is performed on chip in the integrated circuit prior to assembly of the integrated circuit in a functioning system.

11. An apparatus for determining the slack in a monitored path on an integrated circuit, comprising:
    a monitored circuit path;
    a variable delay circuit element coupled to the monitored circuit path;
    a comparator circuit element coupled to the variable delay circuit element; and
    a controller circuit element coupled to the variable delay circuit element, wherein the variable delay circuit element receives a data signal from the monitored path and adds a first delay to the data signal from the monitored path to generate a delayed data signal, wherein a first value of the data signal is compared, in the comparator circuit element, to a second value of the delayed data signal, and wherein the controller determines if the first value and the second value match and outputs a third value corresponding to a second delay of the delayed data signal, the third value being indicative of the slack in the monitored path for evaluating speed performance of the integrated circuit, if the first value and the second value do not match, wherein the third value is used to tune a speed of the integrated circuit.

12. The apparatus of claim 11, wherein the third value corresponds to an amount of delay added to the data signal in a previous comparison of the first value to the second value just prior to the comparison resulting in the first value and second value not matching.

13. The apparatus of claim 11, wherein the controller circuit element increases an amount of the delay added to the data signal if the first value and the second value match.

14. The apparatus of claim 11, wherein the apparatus is embedded in an integrated circuit for dynamically adjusting speed of a path in the integrated circuit based on the third value, wherein the third value is a sensed maximum speed of the integrated circuit based on conditions of the integrated circuit.

15. An apparatus for determining the slack in a monitored path on an integrated circuit, comprising:
    a monitored circuit path;
    a variable delay circuit element coupled to the monitored circuit path;
    a first capture latch coupled to the monitored path that receives a data signal from the monitored path and outputs the data signal to a comparator circuit element;
    a second capture latch coupled to the variable delay circuit element that receives a delayed data signal from the variable delay circuit element and outputs the delayed data signal to the comparator circuit element; and
    a controller circuit element coupled to the variable delay circuit element, wherein the variable delay circuit element receives a data signal from the monitored path and adds a first delay to the data signal from the monitored path to generate the delayed data signal, wherein a first value of the data signal is compared, in the comparator circuit element, to a second value of the delayed data signal, and wherein the controller determines if the first value and the second value match and outputs a third value corresponding to a second delay of the delayed data signal, the third value being indicative of the slack in the monitored path, if the first value and the second value do not match.

16. The apparatus of claim 11, wherein the apparatus operates in response to a functional clocking of the monitored path.

17. The apparatus of claim 11, wherein the apparatus operates in response to an early clocking of the monitored path in which an early clock signal is earlier in time or phase than a functional clock signal.

18. The apparatus of claim 11, wherein the apparatus is on chip in the integrated circuit, and wherein the apparatus operates after assembly of the integrated circuit in a functioning system.

19. The apparatus of claim 11, wherein the apparatus is on chip in the integrated circuit, and wherein the apparatus operates prior to assembly of the integrated circuit in a functioning system.

20. An apparatus for determining the slack in a monitored path on an integrated circuit, comprising:
- means for receiving a data signal from the monitored path;
- means for adding a first delay to the data signal from the monitored path to generate a delayed data signal;
- means for adding a first delay to the data signal from the monitored path to generate a delayed data signal;
- means for comparing a first value of the data signal to a second value of the delayed data signal;
- means for determining if the first value and the second value match; and
- means for outputting a third value corresponding to a second delay of the delayed data signal, the third value being indicative of the slack in the monitored path for evaluating speed performance of the integrated circuit, if the first value and the second value do not match, wherein the third value is used to tune a speed of the integrated circuit.

* * * * *